United States Patent
Globisch et al.

(10) Patent No.: US 12,113,144 B2
(45) Date of Patent: Oct. 8, 2024

(54) ARRANGEMENT FOR AN ANTENNA FOR GENERATING OR RECEIVING TERAHERTZ RADIATION, ANTENNA, TERAHERTZ SYSTEM, AND METHOD FOR PRODUCING AN ARRANGEMENT FOR AN ANTENNA

(71) Applicant: Fraunhofer-Gesellschaft zur Förderung der angewandten Forschung e.V., Munich (DE)

(72) Inventors: Björn Globisch, Berlin (DE); Robert Kohlhaas, Berlin (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 0 days.

(21) Appl. No.: 17/998,096

(22) PCT Filed: May 5, 2021

(86) PCT No.: PCT/EP2021/061881
§ 371 (c)(1),
(2) Date: Jun. 19, 2023

(87) PCT Pub. No.: WO2021/224336
PCT Pub. Date: Nov. 11, 2021

(65) Prior Publication Data
US 2024/0136460 A1   Apr. 25, 2024
US 2024/0234615 A9   Jul. 11, 2024

(30) Foreign Application Priority Data

May 7, 2020   (EP) .................................... 20173549

(51) Int. Cl.
*H01L 31/101*   (2006.01)
*H01L 31/0232*   (2014.01)
(Continued)

(52) U.S. Cl.
CPC ...... *H01L 31/101* (2013.01); *H01L 31/02325* (2013.01); *H01L 31/1892* (2013.01); *H01Q 5/22* (2015.01)

(58) Field of Classification Search
CPC ............ H01L 31/101; H01L 31/02325; H01L 31/1892; H01Q 5/22
See application file for complete search history.

(56) References Cited

U.S. PATENT DOCUMENTS

2001/0029436 A1\* 10/2001 Fukasawa .......... G01N 21/3563
                                                                      702/117
2005/0215031 A1     9/2005 Ouchi
(Continued)

FOREIGN PATENT DOCUMENTS

DE      102007044839 A1   5/2009
DE      102010049658 A1   4/2012
JP      2005176156 A      6/2005

OTHER PUBLICATIONS

"International Application Serial No. PCT/EP2021/061881, International Search Report dated Aug. 2, 2021", (Aug. 2, 2021), 3 pgs.
(Continued)

*Primary Examiner* — Thanh Luu
*Assistant Examiner* — Mai Thi Ngoc Tran
(74) *Attorney, Agent, or Firm* — Schwegman Lundberg & Woessner, P.A.

(57) ABSTRACT

An arrangement for an antenna for generating or receiving terahertz radiation can comprise a photoactive layer which can be activated by optical radiation in the range 1200 nm to 1700 nm, a substrate that is transparent to optical radiation and to which the photoactive layer is attached, and a first adhesion-promoting layer. The first adhesion-promoting layer is arranged between the photoactive layer and the substrate and connects them to each other, wherein first adhesion-promoting layer has a layer thickness of no more (Continued)

than 5 μm. The arrangement can also include and a carrier transparent to the optical radiation. The substrate is attached to the carrier and is arranged between the photoactive layer and the carrier. The substrate and the carrier can be made of the same material.

20 Claims, 11 Drawing Sheets

(51) Int. Cl.
*H01L 31/18* (2006.01)
*H01Q 5/22* (2015.01)

(56) References Cited

U.S. PATENT DOCUMENTS

2013/0306869 A1* 11/2013 Sartorius ............ G01N 21/3581
                                                            250/338.4
2015/0155419 A1*  6/2015 Ouchi ................... H01L 31/101
                                                            257/428

OTHER PUBLICATIONS

"International Application Serial No. PCT/EP2021/061881, Written Opinion dated Aug. 2, 2021", (Aug. 2, 2021), 5 pgs.
Takahashi, R, et al., "Ultrafast 1.55- μm photoresponses in low-temperature-grown InGaAs/InAlAs quantum wells", Applied Physics Letters 65.14, (1994), 1790-1792.

* cited by examiner

ARRANGEMENT FOR AN ANTENNA FOR GENERATING OR RECEIVING TERAHERTZ RADIATION, ANTENNA, TERAHERTZ SYSTEM, AND METHOD FOR PRODUCING AN ARRANGEMENT FOR AN ANTENNA

PRIORITY APPLICATIONS

This application is a U.S. National Stage Filing under 35 U.S.C. § 371 from International Application No. PCT/EP2021/061881, filed on May 5, 2021, and published as WO2021/224336 on Nov. 11, 2021, which claims the benefit of priority to European Application No. 20173549.5, filed on May 7, 2020; the benefit of priority of each of which is hereby claimed herein, and which applications and publication are hereby incorporated herein by reference in their entireties.

The present invention relates to an arrangement for an antenna for generating or receiving terahertz radiation, to an antenna for generating or receiving terahertz radiation, to a terahertz system for generating and coherently detecting terahertz radiation, and to a method for producing an arrangement for an antenna for generating or receiving terahertz radiation.

Here, Terahertz radiation is considered to be electromagnetic radiation of a frequency between 0.05 THz and 20 THz, with the frequency typically being between 0.1 THz and 10 THz. For electronic signal processing, these frequencies are very high, but compared to the frequencies typical for photonics, they are very small, so that a quantum energy of terahertz radiation is still very low. Measuring systems working with terahertz radiation are therefore difficult to realise, which is why terahertz radiation is the last range of the electromagnetic spectrum that has not yet been developed to a satisfactory degree for practical applications.

Terahertz systems typically use opto-electronic semiconductor chips to generate and detect terahertz radiation. A terahertz system usually comprises a laser light source and two THz antennas, each of which is optically coupled to the laser light source via an optical fibre and can be activated by light from this laser light source, the first of said antennas serving as a transmitting antenna and the second as a receiving antenna. In this case, the THz antennas each have a semiconductor chip which is contacted with antenna conductors and comprises at least one photosensitive active layer with a band-edge wavelength that is longer than a wavelength of the laser light source, and at least one layer adjacent to the active layer with a band-edge wavelength that is shorter than the wavelength of the laser light source. Here, the antenna conductors are typically integrated on their respective semiconductor chips. The laser light source can be configured to generate short pulses or to generate beat signals in the THz range by superimposing two laser waves of slightly different wavelengths. The wavelength of a laser light source is defined in the present document as the centre of gravity of a wavelength spectrum of the light generated by the laser light source.

With such terahertz systems, terahertz radiation can now be generated and coherently detected by applying a voltage to the antenna conductors of the transmitting antenna, while the transmitting antenna and the receiving antenna are activated simultaneously or with an adjustable delay with coherent radiation from the laser light source and a current generated in the receiving antenna is measured by means of a sensor connected to the antenna conductors of the receiving antenna. To examine a sample placed between the transmitting antenna and the receiving antenna, a received signal can be detected in this way for different delays of a light travel time between the laser light source and the receiving antenna or the transmitting antenna.

Terahertz systems of this type are known, for example, from documents DE 10 2007 044 839 A1 and DE 10 2010 049 658 A1. By using optical fibres to connect the laser light source to the THz antennas, these terahertz systems can be realised in an advantageously compact, robust and flexible way.

In the following, a THz antenna shown in FIG. 1 according to an example of the prior art is discussed in greater detail. The THz antenna 30 of FIG. 1 comprises a photoactive layer 21 with fast charge carrier recombination time, produced by epitaxial growth on an electrically insulating substrate 22. By vapour deposition and lithography processes, a metal structure 23, 24 is formed as a THz antenna on the photoactive layer and can be formed, for example, in dipole, bow tie or strip-line geometry. The metal structure 23, 24 has a gap through which a short (fs range) light pulse 11 can be directed onto the photoactive layer 21. The antenna 20 of FIG. 1 is formed by way of example as a THz transmitter. In the THz transmitter 20, a voltage is applied to the metal structure 23, 24. Excitation with the light pulse 11 generates photo charge carriers in the photoactive layer and accelerates them strongly in the electric field, generating electromagnetic radiation in the THz range (0.1-10 THz). Due to the large refractive index jump to air, the radiation propagates preferably in the semiconductor material of the layer 21 and the substrate 22. For better coupling of the THz wave in air, the antenna chip or substrate 22 is placed on the flat surface of a hyper-hemispherical Si lens 25 made of high-purity Si with high THz transparency.

The THz receiver looks, in principle, identical in construction. However, no voltage is applied here. Instead, the photocurrent caused by received THz radiation and excited photo charge carriers is measured in the THz receiver. However, a photocurrent only flows if—simultaneously—a voltage is applied by the received THz radiation and photoconduction is caused by the light pulse. In a THz time-domain system, a delay line is therefore placed in one of the beam paths, by means of which the temporal position of received THz radiation and scanning fs light pulse can be varied. This results in "coherent" detection, and with high sensitivity and high velocity potential, the amplitude and phase of the THz wave are scanned in a pump-sample process.

The first THz systems used an excitation wavelength at 800 nm, since powerful pulse lasers with short (fs) pulse width and photoconductors made of "low-temperature" grown LT-GaAs on GaAs substrate with very fast recombination time were available here.

New systems often use excitation wavelengths at 1300 nm and 1550 nm, as many components from developments for optical telecommunications technology are available here. Femtosecond fibre lasers at 1550 nm have now become inexpensive and maintenance-free, and optical fibres allow flexible connections from the laser to moving transmitting and detection heads. This offers considerable advantages for the industrial use of THz sensor technology. However, since GaAs does not absorb at 1550 nm, fast photoconductors first had to be developed for this wavelength range. These are now available, based on InGaAs, InGaAsP, InAlAs, InGaAlAsP and InGaAlAs layers, each grown epitaxially lattice-matched on an InP substrate.

A typical thickness of the photoconductor layers is in the range of 1-2 μm, which roughly corresponds to the penetration depth (1/e) of the exciting light. Thicker layers require more effort for epitaxial growth. However, hardly any more photo charge carriers are generated. By contrast, the background dark current (noise) increases unfavourably. In addition, long paths from the excitation point deep in the layer to surface contacts have an unfavourable influence on the time behaviour (bandwidth of detection).

In the advantageously thin layers, the exciting optical radiation is not completely absorbed. This is not a problem with 800 nm systems, because the GaAs substrate also absorbs here, and with a typical substrate thickness of 300-500 µm, the exciting optical radiation is completely removed from the system. However, the InP substrate is typically transparent for wavelengths above 1000 nm. Residual light behind the photoactive layer (i.e. behind the photoconductor), which has not been absorbed by the photoactive layer, is therefore not absorbed in the downstream substrate, but remains in the system and can impair its function. It is particularly critical if residual light pulses activate the transmitting or receiving antenna with the wrong timing. Thus, the laser pulse exciting the transmitting antenna can also reach the receiving antenna via the THz imaging optics. To block this path, the prior art uses, for example, light filters in the THz beam path. What cannot be achieved with these external filters, however, is the blocking of interference pulses caused by internal reflections at interfaces within the THz antennas.

Such internal optical reflections are indicated by the dashed lines in FIG. 2, which shows a similar structure to FIG. 1. If these laser pulses excite the photoconductor layer a second time with an unfavourable time delay and thus generate "echo" THz pulses 27 there, then this can significantly impair the function of a THz sensor system. Measurements of a prior art system show these interference pulses very clearly, cf. THz echo pulses 27 in FIG. 3. It would thus be advantageous if these THz echo pulses 27 caused by optical reflections can be avoided or at least reduced, since echo pulses of even the smallest amplitudes can significantly interfere with measurements.

The disturbance caused by optical reflections will be assessed below. Here, it must be considered that not only the amplitude is taken into account when evaluating a disturbance caused by optical reflections, but also the time position of an echo pulse, namely 1. compared to the spatial extent of the optical pulse and
2. in relation to the time position of the measurement window.

First, as an example, the disturbance of the echo pulse is estimated on the basis of the spatial extent of the optical pulse and at near interfaces. A typically used laser pulse of a time width of 100 femtoseconds has—derived from the speed of light—a spatial width of 30 µm in air and of about 10 µm in semiconductors with a refractive index close to n=3 (InP: 3.167 at a wavelength of 1550 nm). With a photoconductor layer thickness of typically 2-3 µm, a pulse spatially extended by 10 µm more thus excites the photoconduction. Reflections at or near the photoconductor interface are not perceived as a separate echo, but become part of a slightly broader excitation pulse. A free photoconductor layer would therefore not produce any echoes despite large refractive index jumps at the interfaces. However, such a layer would not be sufficiently stable mechanically.

With respect to the time position of the measurement window and to distant interfaces, the disturbance of the echo pulse can be estimated as follows. Reflections at more distant interfaces typically lead to echo pulses far outside the measurement window. Thus, the reflections on the outside of an Si lens (cf. lens 25 of FIG. 1) against air—due to the high refractive index jump $\Delta n$ of about 2.5 (refractive index of Si: 3.478 at a wavelength of 1550 nm, refractive index of air: approximately 1 at a wavelength of 1550 nm)—have a very high amplitude. The distance between the photoconductor layer and the outside of the Si lens is quite large at 7.35 mm, wherein a thickness of the InP substrate of about 350 µm and a thickness of the Si lens of about 7 mm were assumed here. Since the echo pulse travels this path twice, the additional travel distance against the original pulse is about 14.7 mm. If the refractive index of approximately 3.4 is also taken into account, there is even an additional optical path length of approximately 50 mm and thus a delay of the echo pulse of approximately 150 ps. Thus, these echo pulses are outside the typical measurement windows and do not usually interfere with the measurements.

The interface between the InP substrate (n=3.167 at 1550 nm) and Si lens (n=3.478 at 1550 nm) exhibits a refractive index jump of $\Delta n=0.311$ with flush contact. However, this flush areal contact is difficult to achieve—especially due to the limited planarity of the brittle InP substrate. If, as a result, an air gap forms between InP and Si in some regions, then considerably higher reflections can be expected at the semiconductor-air interfaces. However, the width of the air gap relative to the wavelength also plays a role. In the case of a terahertz wave with wavelengths in the 100 µm range (3 THz), the wave, which decays only relatively slowly, projects beyond a sub-µm gap into the second semiconductor material and propagates there, so that a high reflection cannot yet form here. For the exciting laser pulse with a wavelength of, for example, 1.5 µm, however, the first resonator mode of highest reflection is already formed at a gap width of 0.75 µm (half wavelength), and the increase in reflection therefore already starts at smaller gap widths. Small sub-µm air gaps thus have little effect on THz waves because of the difference in wavelength by orders of magnitude, while the optical excitation pulse experiences high reflection.

In the THz systems considered above with long-wave excitation at 1.5 µm wavelength of epitaxial layers on an InP substrate transparent for this wavelength, it is in summary the optical reflections at the interface between the InP substrate and the Si lens (cf. interface 26 in FIG. 2) that lead to interfering echo pulses, wherein the echo pulses hit and excite the photoactive layer a second time with a delay. The THz transmitter thereby emits echo pulses, and in the receiver the received THz signal is scanned a second time. Therefore, time-delayed replicas of the THz signal patterns are created.

For example, the following statements can be made about the timing of the optical reflection at the InP substrate to Si lens interface. The InP substrate shown in FIGS. 1 and 2 typically has a thickness of 350 µm, so a round trip is 700 µm. If the speed of light in InP via the refractive index is included, the result is a delay of the echo to the main pulse of approximately 7 ps. Such a delay of the echo pulses is measurable and clearly visible in FIG. 3.

If, for example, it is sought to measure a sample with a multilayer structure with layer thicknesses in the range of a few 100 µm, the pulses reflected at the front and back of the layer (outward and return path 200 µm) are also several ps apart (assuming a refractive index of 1.5 for the sample). Taking into account the multilayer structure of the sample, the width of the THz pulses, and the low amplitude of the reflection at the inner paint interfaces, it becomes clear that echo pulses of this timing significantly impair the measurement accuracy.

The reflections between the InP substrate and the Si lens are indeed the critical reflections, as also shown by measurements when using THz antennas in a time-domain system (cf. FIG. 3). Observed are pre- and post-pulses with a distance of approximately 7 ps to the main pulse. As described above, these 7 ps correspond exactly to the time delay of echo pulses due to reflection of the laser pulse at the interface between the InP substrate and the Si lens. Due to thickness variations of the InP substrate (nominally 350 µm), the timing of one pulse varies slightly when comparing different THz transmitting chips.

The echo pulses on the other time axis side (cf. FIG. 3) are caused by the reflections of the fs laser in the THz receiver. The receiver is the same in all measurements, which is why the associated echo pulses also overlap well. In principle, these echo pulses can be calculated out in a fixed measuring system. However, it becomes critical when a weak measurement signal is close to one of the echo pulses. This will be explained on the basis of an important application example.

Important areas of application arise from the fact that THz radiation (0.1 THz to 30 THz) can penetrate many dielectric materials, such as plastics, paints and paper, that are opaque to visible light. This creates application possibilities in non-destructive material testing. There is a demand, for example, for the measurement of the thickness of individual layers of plastic materials in composite substances, preferably contact-free already during the production process (for example extrusion).

Another example is the measurement of the thickness of paint layers 32 (cf. FIG. 4), specifically within multi-layer systems and contact-free when paints are still wet, so that the ongoing painting process of, for example, a car body can be controlled. For this measurement, a THz pulse 12 is directed onto a painted metal surface 33. At the different interfaces between the paint layers 32 (typically rust protection—filling—coloured paint—clear coat) as well as the metal carrier 33, reflections 34 now occur which differ in time position. The reflected THz pulses 34 are now directed to the receiving antenna 31 and there the time offset of the reflected THz pulses is measured with the scanning laser pulse. Knowing the refractive indices of the layers 32, the individual thicknesses in the layer assembly can now be determined. The refractive indices of the paints are often in the range of 1.5 to 1.6 for THz radiation.

It must be borne in mind that the refractive indices of the paints differ only slightly from each other, so that the reflection amplitudes at the inner interfaces are small, whereas the interfaces between air and paint or paint and metal cause much stronger reflections. This THz reflection pattern 34 is schematically sketched in FIG. 4.

If the THz transmitter 30 now emits echo pulses through optical multiple excitation, a time-delayed replica 35 of the reflection pattern 34 is created (cf. FIG. 5). In the replica 35, the strong reflection at the air boundary can be just next to the weak reflections of the main pulse at the internal interfaces, cf. FIG. 5. Furthermore, echo pulses in the receiver 31 can cause the strong reflection at the paint-metal interface to fall precisely in the time window in which the main pulse scans the weak reflections at the transitions between the individual paint layers.

It is therefore obvious from the above that the measurement quality can also be considerably affected by weak echo pulses. Echoes in the THz antennas—both in transmitter 30 and receiver 31—should therefore be avoided at all costs.

The example presented above is intended to illustrate the importance of echo cancellation. However, also in measurement systems in transmission arrangement or in spectroscopic analyses where a Fourier transformation of the detected pulse train is used, the echo pulses can interfere considerably and their interfering effect cannot always be calculated out. In so-called "continuous wave" THz systems (CW THz systems), echo signals are not so obvious, but here too they understandably deform the optical beat signals and the phase and shape of the THz waves.

It is the object of the invention to design an arrangement with which the problems described above can be at least partially solved. It would be particularly advantageous to provide an arrangement with which the aforementioned echo pulses can be prevented or at least reduced. Furthermore, it would be advantageous if a method for producing the arrangement can be provided.

This object is achieved in accordance with the invention by an arrangement, an antenna, a terahertz system and a method according to the independent claims. Developments are the subject of the dependent claims and the description below.

In accordance with one aspect of the present invention, there is provided an arrangement for an antenna for generating or receiving terahertz radiation. The arrangement comprises:
 a photoactive layer which can be activated by optical radiation in the range 1200 nm to 1700 nm,
 a substrate that is transparent to optical radiation and to which the photoactive layer is attached,
 a carrier transparent to the optical radiation, wherein the substrate is attached to the carrier and is arranged between the photoactive layer and the carrier.

The substrate and the carrier are made of the same material. Further, the arrangement comprises a first adhesion-promoting layer, wherein the first adhesion-promoting layer is arranged between the photoactive layer and the substrate and connects them to each other flat. The first adhesion-promoting layer has a layer thickness of at most 5 µm.

Due to the low thickness of the first adhesion-promoting layer, the travel time of the light to the substrate interface and back is relatively short. Thus, optical reflections caused by the first adhesion-promoting layer excite the photoactive layer almost simultaneously with the excitation light. Thus, spatially separated echo pulses can be avoided.

Because the substrate and the carrier are made of the same material, they have the same refractive index. Consequently, there is no jump in the refractive index at the transition of the materials. This can considerably reduce reflections at the interfaces of the materials and thus the above-mentioned optical reflections or optical echo pulses.

The first adhesion-promoting layer enables flush areal contact between the photoactive layer and the substrate. In this way, air gaps between the photoactive layer and the substrate can be prevented or reduced. Due to the low layer thickness of the adhesion-promoting layer, interfaces can be brought close to the photoactive layer so that pulses reflected at the substrate to adhesion-promoting layer interface are within the pulse width of the original optical pulses. This allows the reflected optical pulses to merge with the original pulse, thus avoiding the formation of separate echo pulses.

Materials or components shall be referred to as transparent for the purposes of the present document if they are penetrable by at least 90% and/or at least 95% and/or 99% of the incident radiation in the electromagnetic spectral range of interest.

The photoactive layer can have a layer thickness that is smaller than a substrate thickness of the substrate. For example, the photoactive layer has a thickness of at most 10

µm, especially at most 5 µm. In particular, the layer thickness can be in the range of 1 µm to 2 µm. However, such layer thicknesses are often not sufficiently mechanically stable. The substrate thus mainly serves to mechanically stabilise the photoactive layer.

The substrate can have a thickness that is at least 10 times or at least 100 times greater than the thickness of the photoactive layer. It can be provided that the substrate has a substrate thickness of at most 1 mm, especially at most 0.5 mm and/or at least 0.2 mm, in particular at least 0.3 mm. Such substrate thicknesses are typical for semiconductor discs or wafers. The substrate can thus be made of a semiconductor disc, especially a wafer or a semiconductor chip. The photoactive layer attached to the wafer can then be subjected to typical wafer processing, thus allowing a variety of structures to be processed in parallel. A side of the substrate facing away from the photoactive layer is especially directly adjacent to the carrier. This can also reduce disturbing reflections.

According to one variant, the carrier has a carrier thickness of at least 3 mm, especially at least 5 mm, in particular at least 7 mm. The substrate thickness is thus usually smaller than the carrier thickness. For example, the carrier thickness can be at least five times the substrate thickness. Due to the relatively large carrier thickness compared to the layer thickness and the substrate thickness, the optical travel times of the optical radiation in the carrier can be relatively long, which means that the optical reflections can be shifted in time.

Thus, unavoidable reflective interfaces at a distance from the photoactive layer can be shifted outside a measurement window of interest by increasing the thickness of the adjacent carrier so that the measurement is no longer affected. Thicknesses or layer thicknesses are especially measured perpendicular to layer planes and/or perpendicular to planar surfaces in the present document. Typically, all thicknesses and layer thicknesses are measured in the same direction.

It can be provided that a side of the photoactive layer facing away from the substrate is free of coating, at least in some regions, and in particular is exposed to the ambient air. Due to the production process (see below), the side of the photoactive layer facing away from the substrate may have InP residues in some regions.

Optical radiation in the sense of the present document is understood to be the electromagnetic radiation required to excite the photoactive layer so that electron-hole pairs are generated in the photoactive layer. The excitation energy of the optical radiation depends here on a band gap, i.e. a distance between a valence band and a conduction band, of the photoactive material used. Conversely, the photoactive material of the photoactive layer can be selected in such a way that the band gap is tuned to a specific excitation energy. Insofar as the band gap is temperature-dependent, its values defined in the usual manner at operating temperature are always meant here, typically between 10° C. and 50° C., especially between 15° C. and 25° C. In order to be able to fall back on known components of optical telecommunication technology, the photoactive layer will have a band gap corresponding to an excitation wavelength of at least 1200 nm, especially at least 1250 and/or at most 1700 nm, especially at most 1650 nm. For example, the photoactive layer can be produced at least predominantly from a semiconductor material, such as InGaAs, InAlAs, InGaAsP, InGaAlAs, InGaAlAsP and/or GaAlAs, or can comprise a combination of several semiconductors. The semiconductor used is usually doped with a transition metal, in particular Fe, Rh or Ru. A concentration of the transition metal in the photoactive layer can be at least $10^{18}$ cm$^{-3}$, especially at least $10^{19}$ cm$^{-3}$.

Especially, the photoactive layer is formed from a single layer of the photoactive material.

Alternatively, the photoactive layer can comprise several sub-layers. For example, at least one active layer and one adjacent layer can be provided. As a rule, the active layer or each of the active layers will be embedded between two adjacent layers. The adjacent layers serve here as recombination layers. It can be provided that the photoactive layer has a periodic layer structure with multiple alternately arranged active layers and recombination layers; wherein for example 100 or more active layers can be provided.

The effect of remaining echo pulses can be further minimised or reduced by limiting the extent of the photoactive layer to the absolutely necessary area. The photoactive layer can have a footprint of at most 1 mm$^2$, especially at most 0.1 mm$^2$, preferably at most 0.01 mm$^2$. A perpendicular projection of the photoactive layer onto the substrate can have an area of at most 1 mm$^2$, especially at most 0.1 mm$^2$, preferably at most 0.01 mm$^2$. The mentioned projection perpendicular to the substrate is here a parallel projection, i.e. the projection rays emanating from the photoactive layer, which are called projection lines, are parallel to each other. The photoactive layer can have a lateral extent measured parallel to the substrate and/or a diameter of at most 1 mm, preferably at most 0.1 mm. In particular, the photoactive layer can be in the form of a mesa structure.

The substrate can, for example, be embodied as a plane-parallel plate. The carrier can be formed as a plane-parallel body or as a wedge-shaped body. The substrate can be directly adjacent to the carrier, i.e. without an adhesive bond or layer in between. In alternative embodiments, a second adhesion-promoting layer is provided and is arranged between the substrate and the carrier and connects them to each other flat.

The first adhesion-promoting layer and the second adhesion-promoting layer can be made of the same material or can comprise different materials. Different materials can be considered for the various adhesion-promoting layers. On the one hand, the components that are to be connected should be connected flush and flat by the material. On the other hand, the material should be transparent for the THz radiation and/or the optical radiation. In one embodiment, the first adhesion-promoting layer and/or the second adhesion-promoting layer is an adhesive layer, for example a layer made of benzocyclobutene (BCB). Other suitable materials are also conceivable.

In one embodiment, the substrate is a silicon wafer. The carrier can be embodied as a silicon body. Silicon wafers and silicon bodies are available with high surface planarity. In addition, thin Si wafers (0.2 mm-1 mm) are usually elastic and bendable, and adapt well to the adjacent silicon body, i.e. the carrier. In some embodiments, van der Waals forces/cohesion can be used to create gapless Si—Si connections between the substrate embodied as an Si wafer and the carrier embodied as an Si body. This can advantageously prevent air gaps between the carrier and the substrate, and thus refractive index jumps.

The arrangement can also include a lens for terahertz radiation. Typically convex lenses, especially plano-convex lenses, are used. Often a hemispheric lens or a hyperhemispheric lens is used here. According to one embodiment, the lens is attached to the carrier. The lens can be adjacent to the carrier. However, a third adhesion-promoting layer can also be provided between the carrier and the lens and connects them to each other flat. Alternatively, the lens can form the carrier. In this case, the substrate is therefore attached directly to the lens without an additional carrier. According to one variant, the lens is made of the same material as the substrate and/or the carrier. Alternatively, the lens can also be made of a polymer material such as polymethylpentene (also called TPX or PMP). A lens thickness, usually measured at a thickest point of the lens, can be at least 2 mm, especially at least 3 mm. The lens thickness and the carrier thickness can be the same.

The substrate and/or the carrier and/or the lens are usually made of an electrically insulating material. The substrate and/or the carrier and/or the lens are usually transparent to the generated terahertz radiation. Furthermore, the lens is usually also transparent to optical radiation.

According to another aspect of the present invention, an antenna for generating or receiving terahertz radiation is provided. The antenna comprises the arrangement of the type described above. Furthermore, the antenna comprises an antenna conductor having a first sub-structure and a second sub-structure. The first sub-structure and the second sub-structure are spaced apart by a gap and contact the photoactive layer. Here, the sub-structures can contact the photoactive layer both electrically and mechanically. The antenna conductor is usually made of one metal and in this case can have two metal structures. In particular, the antenna conductor can be formed by vapour-deposited or sputtered metal. Due to the geometry of the sub-structures, for example dipole, bow-tie or so-called strip-line antennas are formed.

Typically, at least the receiver antenna of the THz system will be based on a photoconductor. The same can be the case with the transmitting antenna too. The transmitting antenna can also be based on a photodiode instead of a photoconductor, cf. publication DE 10 2010 049 658 A1. By using a photodiode, a particularly high efficiency of the transmitting antenna can be achieved.

The photoactive layer can be contacted with the antenna conductor at a surface or at lateral end faces. For example, the antenna conductor is arranged on a side of the photoactive layer facing away from or towards the substrate. Alternatively, the first sub-structure and the second sub-structure can be arranged next to the photoactive layer on the substrate. In this case, the photoactive layer can be arranged between the two structures.

According to a further aspect, a terahertz system for generating and coherently detecting terahertz radiation is proposed. The terahertz system comprises a laser light source and two THz antennas, each optically coupled to the laser light source and activatable by optical radiation from this laser light source, the first of said antennas serving as a transmitting antenna and a second as a receiving antenna. The transmitting antenna and/or the receiving antenna each comprise an antenna of the type described above.

The light from the laser light source especially has a wavelength of at least 1200 nm, in particular at least 1250 nm and/or at most 1700 nm, in particular at most 1680 nm. According to some embodiments, a pulsed laser is used as the laser light source. Alternatively, a continuous wave laser (CW laser) can be used.

The wavelength of the laser light source of the terahertz system can be in one of the telecommunications bands, for example in the O-band, E-band, S-band, C-band, L-band and/or U-band in the wavelength range between 1260 nm and 1675 nm, in particular at 1300 nm and 1550 nm. The use of a pulsed laser as a laser light source for activating the THz antennas is particularly advantageous if both THz antennas are photoconductor-based, since a high transmission power and a high receiving sensitivity can be realised particularly well with a pulsed laser. For an embodiment of the terahertz system as a pulse system, a femtosecond pulse laser with a wavelength between 1200 nm and 1700 nm can be used. Femtosecond pulses have a duration of less than one picosecond, for example between 10 fs and 990 fs.

In other embodiments, the laser light source can be an optical beat source. For example, the laser light source can be provided by a dual mode laser or a system of two lasers and can be arranged to generate a beat signal of two laser waves, wherein a beat frequency of this beat signal should be at least 0.05 THz and is typically between 0.05 THz and 20 THz, especially between 0.1 THz and 10 THz, in order to generate terahertz radiation of appropriate frequency and wavelength. The embodiment with a dual-mode laser or a system of two lasers and the activation of the THz antennas with a corresponding beat signal leads to satisfactory results in particular if the transmitting antenna is photodiode-based, since the use of a photodiode-based transmitting antenna avoids the problem of excessively low transmitting powers, which is particularly serious in the case of activation by a beat signal.

Especially, a lens arrangement is provided for focusing the laser light onto the photoactive layer. Since the laser light or optical radiation is usually not completely absorbed by the photoactive layer, a remaining part of the light passes through the photoactive layer and downstream layers (substrate, adhesion-promoting layer, carrier and/or THz lens). An optical echo pulse reflected at a certain distance typically hits the photoactive layer divergently and can generate photo charge carriers there again over a large area. Even at a certain distance from the sub-structures of the antenna guide, these photo charge carriers can still activate the antenna guide, generating THz echo pulses. For this reason, it is advantageous if a lateral extent of the photoactive layer is limited in such a way that the divergently reflected echo pulse can no longer hit the photoactive layer. To realise this, the photoactive layer can be formed as a mesa structure, for example. The sub-structures can then be formed as side contacts. In this case, the photoelectric effect does not take place outside the mesa, and thus a large part of the optical echo pulses remain ineffective with regard to an excitation of the photoactive layer. For a preferred maximum lateral extent or areal extent of the photoactive layer, please refer to the dimensions mentioned above.

In accordance with a further aspect, a method for producing an arrangement for an antenna for generating or receiving terahertz radiation is provided. The method comprises at least the steps of:

producing a photoactive layer on an auxiliary substrate which is at least predominantly formed from InP, connecting the photoactive layer flat to a substrate by means of a first adhesion-promoting layer which has a layer thickness of at most 5 µm, removing the auxiliary substrate, especially by chemical etching, and attaching the substrate to a carrier so that the substrate is arranged between the photoactive layer and the carrier.

The photoactive layer can be activated by optical radiation in the range 1200 nm to 1700 nm. In addition, the substrate and the carrier are made of the same material. The substrate and the carrier are also transparent to optical radiation.

In particular, the photoactive layer can be grown epitaxially lattice-matched on the auxiliary substrate made of InP. Suitable materials for the photoactive layer with the required band gap can comprise InGaAs, InAlAs, InGaAsP, InGaA-lAs, InGaAlAsP and/or GaAlAs. For further properties of the photoactive layer, please refer to the explanations above.

Disadvantages of an InP-based substrate are described above (for example refractive index jump from InP to Si; InP is often brittle, thus creating air gaps at the interfaces of the components). Therefore, in accordance with the invention, the InP material is only used as an auxiliary substrate for growing the photoactive layer. After producing the photoactive layer, the auxiliary substrate made of InP is removed. The auxiliary substrate is especially removed by chemical etching. Alternatively, the auxiliary substrate can be removed by mechanical etching. Especially, the auxiliary substrate is completely removed. Although complete removal of the auxiliary substrate is the objective, it is possible that in the arrangement produced by the method described, the photoactive layer has detectable material residues of the auxiliary substrate on a side facing away from the substrate. The photoactive layer produced on the InP auxiliary substrate alone is usually not sufficiently mechanically stable, as the photoactive layer often has a layer thickness of a few micrometres at most. For this reason, the photoactive layer is bonded to the substrate before the removal of the InP auxiliary substrate, which is thus provided to stabilise the photoactive layer. Before removing the auxiliary substrate, the substrate and the auxiliary substrate are usually on opposite sides of the photoactive layer.

According to one variant, the photoactive layer is grown by means of molecular beam epitaxy at a temperature of 200° C. to 450° C., especially 400° C. According to another variant, the photoactive layer is epitaxially grown and doped with a transition metal such as Fe, Rh, or Ru, especially in concentrations above $10^{18}$ cm$^{-3}$.

The method can be supplemented by the following process step:

applying an antenna conductor having a first sub-structure and a second sub-structure to the photoactive layer such that the two sub-structures are spaced apart from one another and contact the photoactive layer.

Here, the step of applying the antenna conductor to the photoactive layer can take place before the photoactive layer is connected to the substrate or after the removal of the auxiliary substrate.

Optionally, a lateral extent of the photoactive layer can be reduced, for example to form a mesa structure. This can be done, for example, wet-chemically and/or by dry etching processes. In one variant of the method, a surface passivation can be provided on the photoactive layer. The surface passivation can comprise, for example, silicon nitride and/or silicon oxide.

The substrate can still be present as an unprocessed wafer on which at least one structure is arranged before being attached to the carrier. Thus, at least one structure (sub-assembly) comprising the photoactive layer, the first adhesion-promoting layer and/or the antenna conductor can be attached to the substrate. Typically, a plurality of separate structures, for example at least 5, at least 10, at least 50 or even at least 100 structures, are arranged on the substrate. This allows processing of the active layer on the substrate with established semiconductor manufacturing technologies for the parallel design of a variety of different structures. The various processed structures can then be singularised or separated from each other. In particular, the substrate wafer can be divided into individual chips. The method can thus be completed by separating the structures processed on the substrate and attaching the substrate with the processed structure to the carrier to form the above-mentioned assembly.

The method is particularly suitable for producing the above-mentioned arrangement and the above-mentioned antenna. Features mentioned in relation to the arrangement and the antenna can also be claimed for the method, and vice versa.

Exemplary embodiments of the arrangement, the antenna and the terahertz system are shown in the appended figures and are explained in greater detail in the following description.

In the Figures

Figure 11:
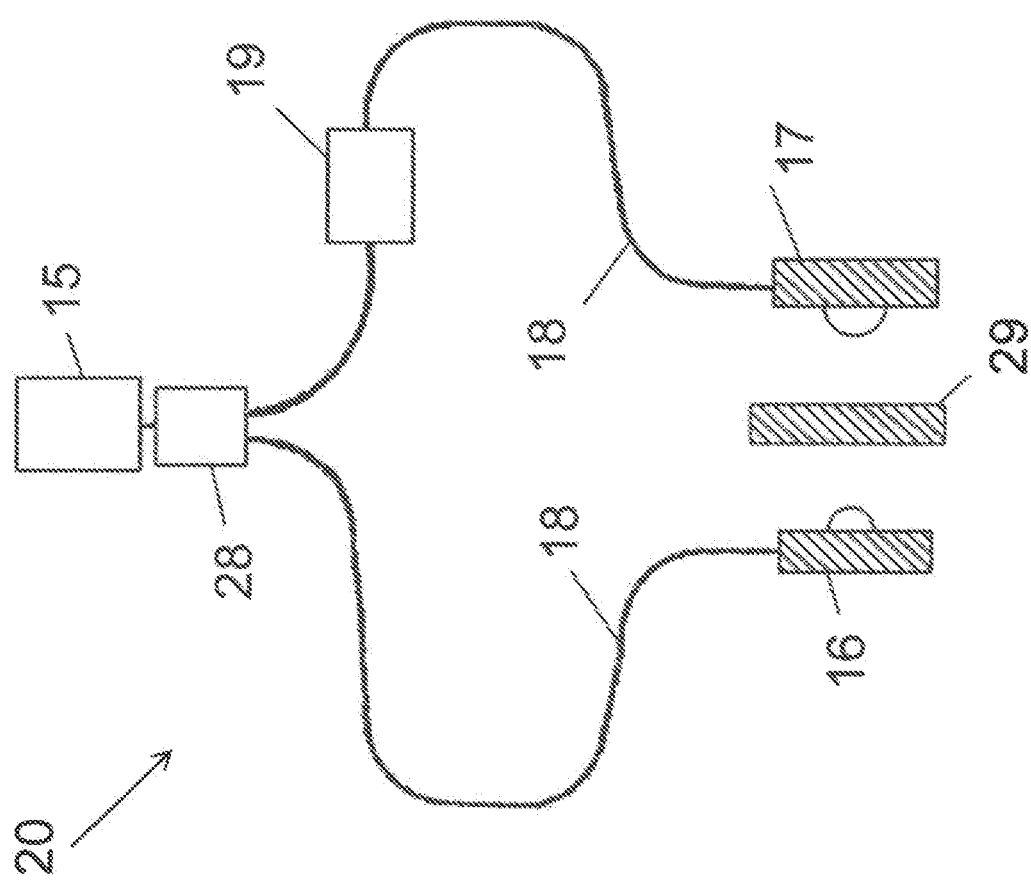
FIG. 11 shows a schematic representation of a terahertz system for generating and coherently detecting terahertz radiation according to one embodiment of the present invention.

The terahertz system 20 shown in FIG. 11 has a laser light source 15, a transmitting antenna 16 and a receiving antenna 17. The transmitting antenna 16 and the receiving antenna 17 are each a THz antenna that can be activated by light from the laser light source 15. For this purpose, a beam splitter 28 is connected after an output of the laser light source 15, wherein the transmitting antenna 16 and the receiving antenna 17 are connected to one each of two outputs of the beam splitter 28 by an optical fibre 18.

The laser light source 15 is a pulsed laser, wherein a wavelength of the laser light source 15 is between 1200 nm and 1700 nm and is especially 1300 nm or 1550 nm. A controllable optical delay circuit 19 can be arranged at an input or in a path of one of the optical fibres 18 for shifting a relative timing of optical control signals to activate the two THz antennas 16, 17. For this purpose, the delay circuit 19 can have, for example, a delay line to which a variable electric field can be applied. Lastly, a sample 29 arranged between the transmitting antenna 16 and the receiving antenna 17 is also shown and can be examined with the terahertz system 20.

The pulse laser forming the laser light source 15 can be a fibre pulse laser, for example with erbium doping, or a semiconductor pulse laser, for example based on a InGaAsP/InP material system.

For further details of the terahertz system 20, reference is made to publication DE 10 2010 049 658 A1.

In the following, individual times of the THz antennas 16 and 17 of the terahertz system 20 will be discussed. FIGS. 6 to 10 schematically show THz antennas according to embodiments of the present invention. For the sake of clarity, only THz transmitting antennas 16 are shown here. However, it is clear that the THz transmitting antennas shown in FIGS. 6-10 can also be used as THz receiving antennas.

Figure 1:
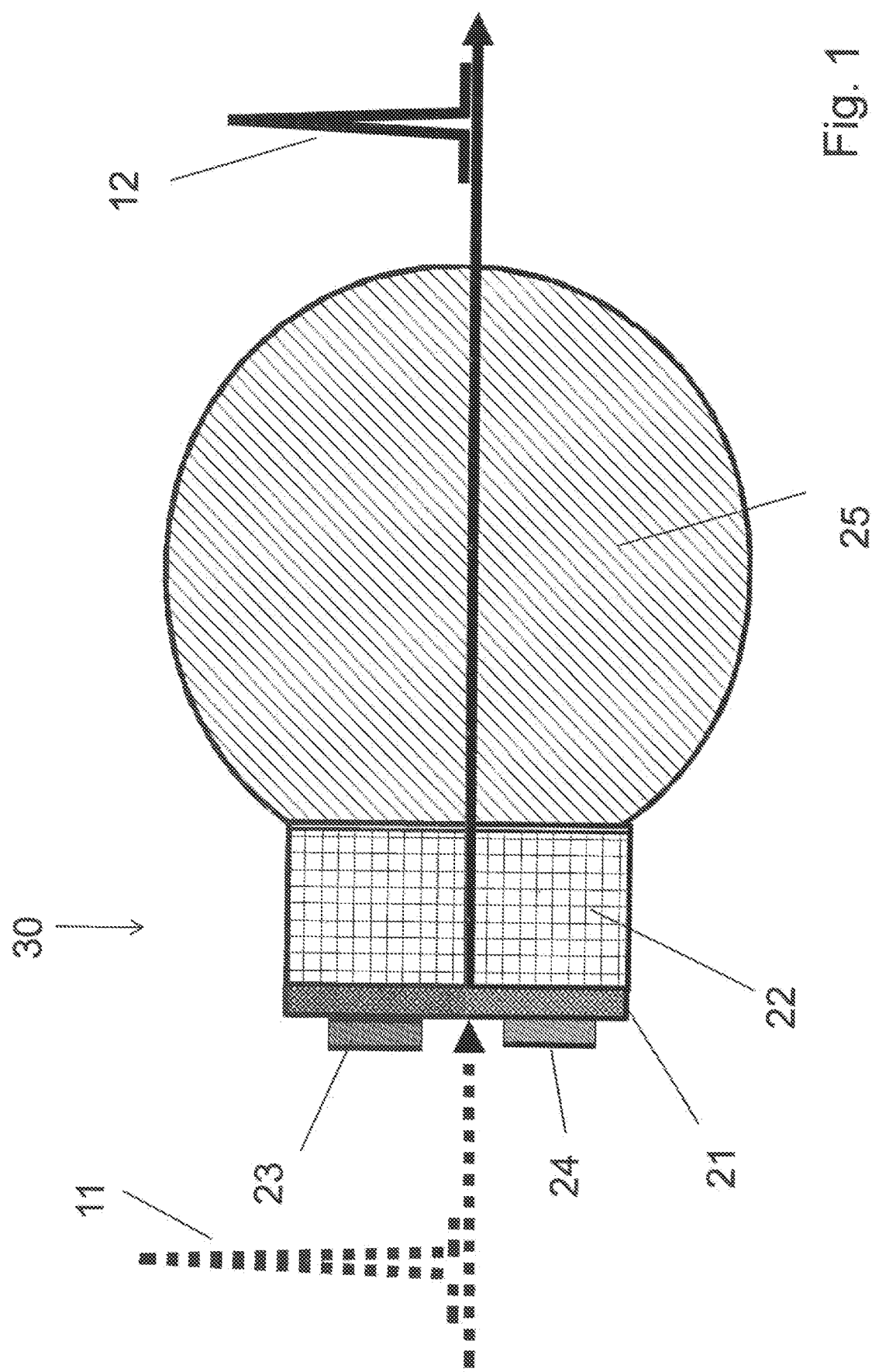
FIG. 1 shows a schematic representation of a photoconductive THz antenna according to the prior art.
Figure 2:
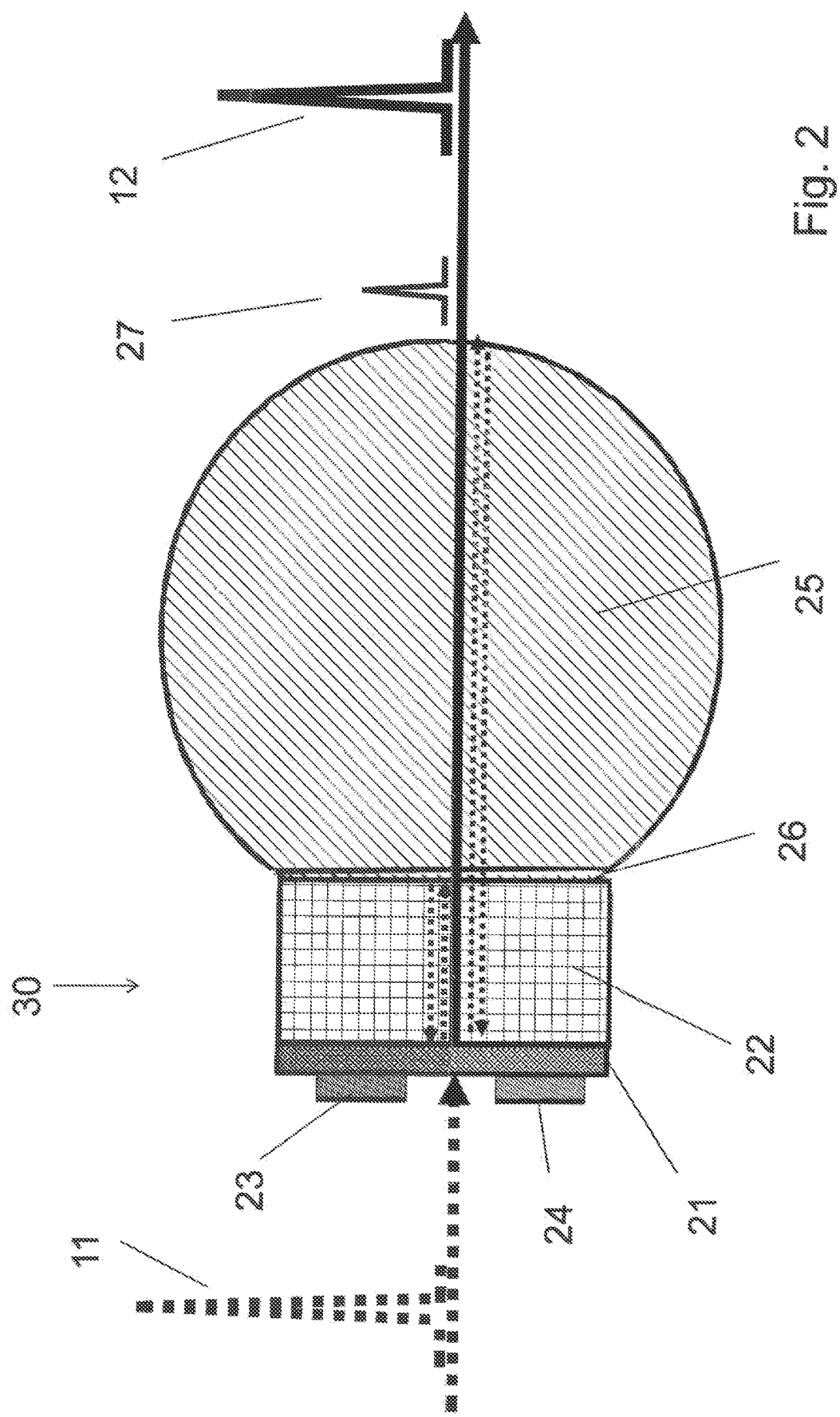
FIG. 2 shows the photoconductive THz antenna from FIG. 1 with optical reflections.
Figure 3:
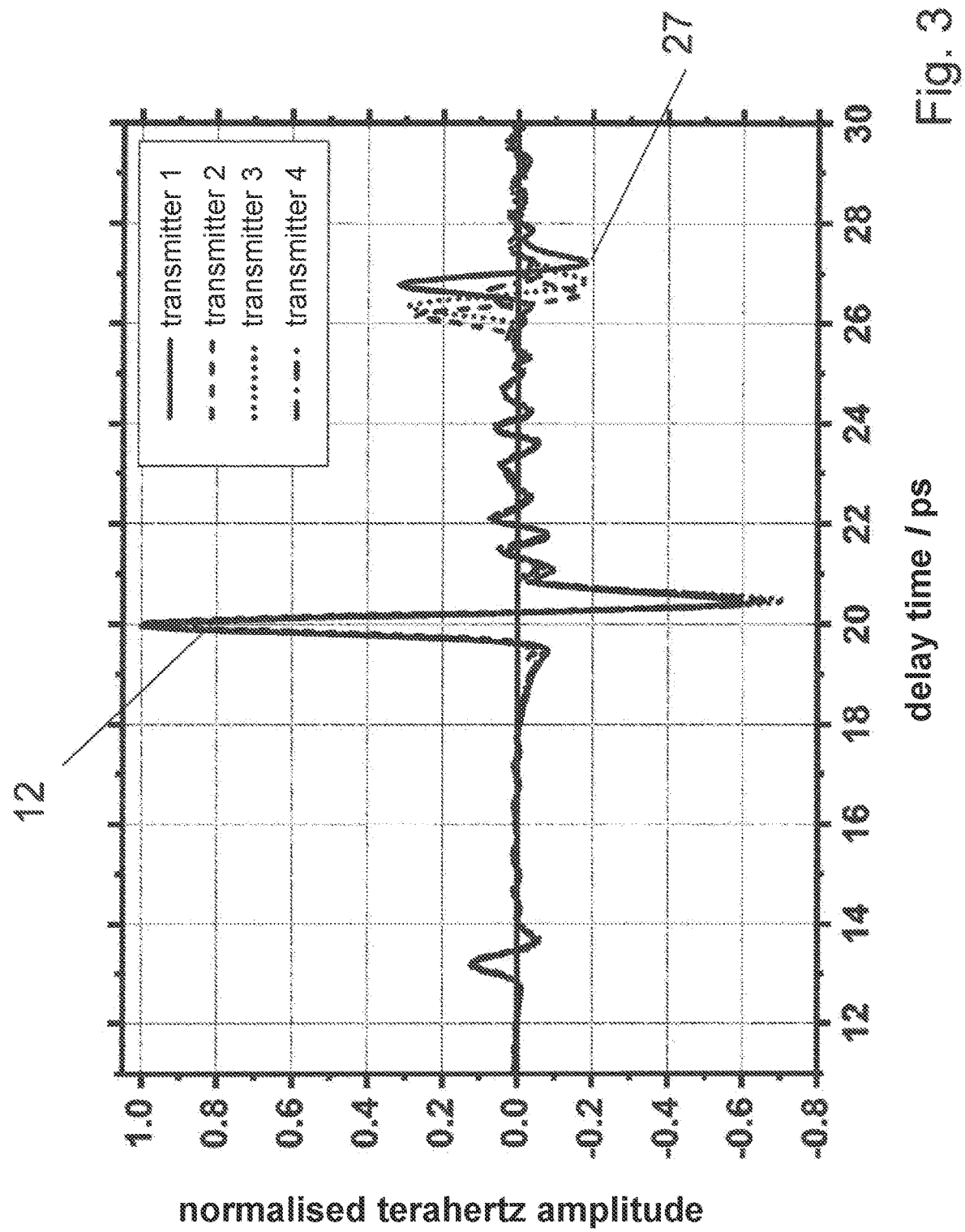
FIG. 3 shows normalised terahertz amplitudes from different THz transmitters plotted over a delay time and measured in a prior art THz receiving antenna.
Figure 4:
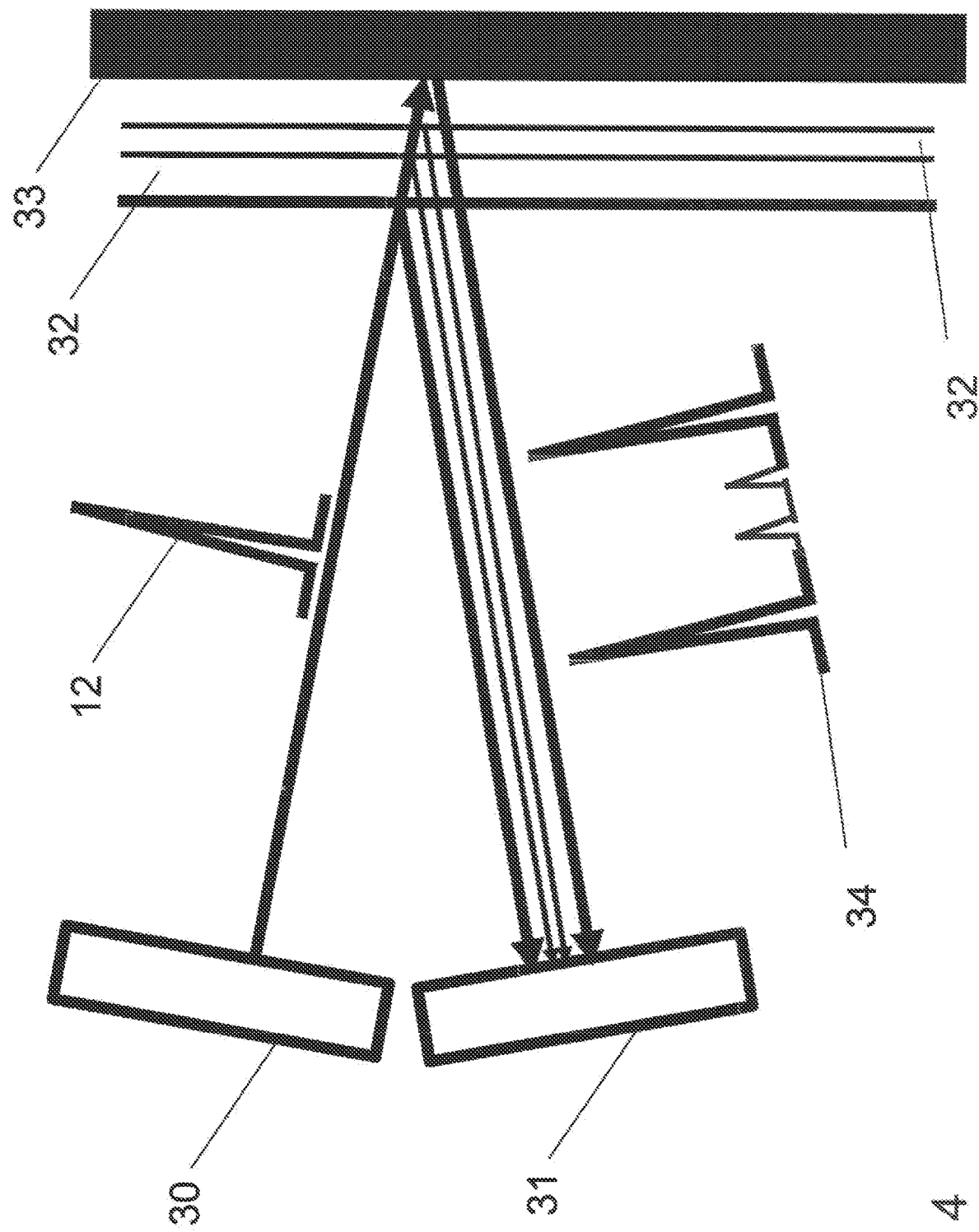
FIG. 4 shows schematically a set-up for measuring the thickness of paint layers.
Figure 5:
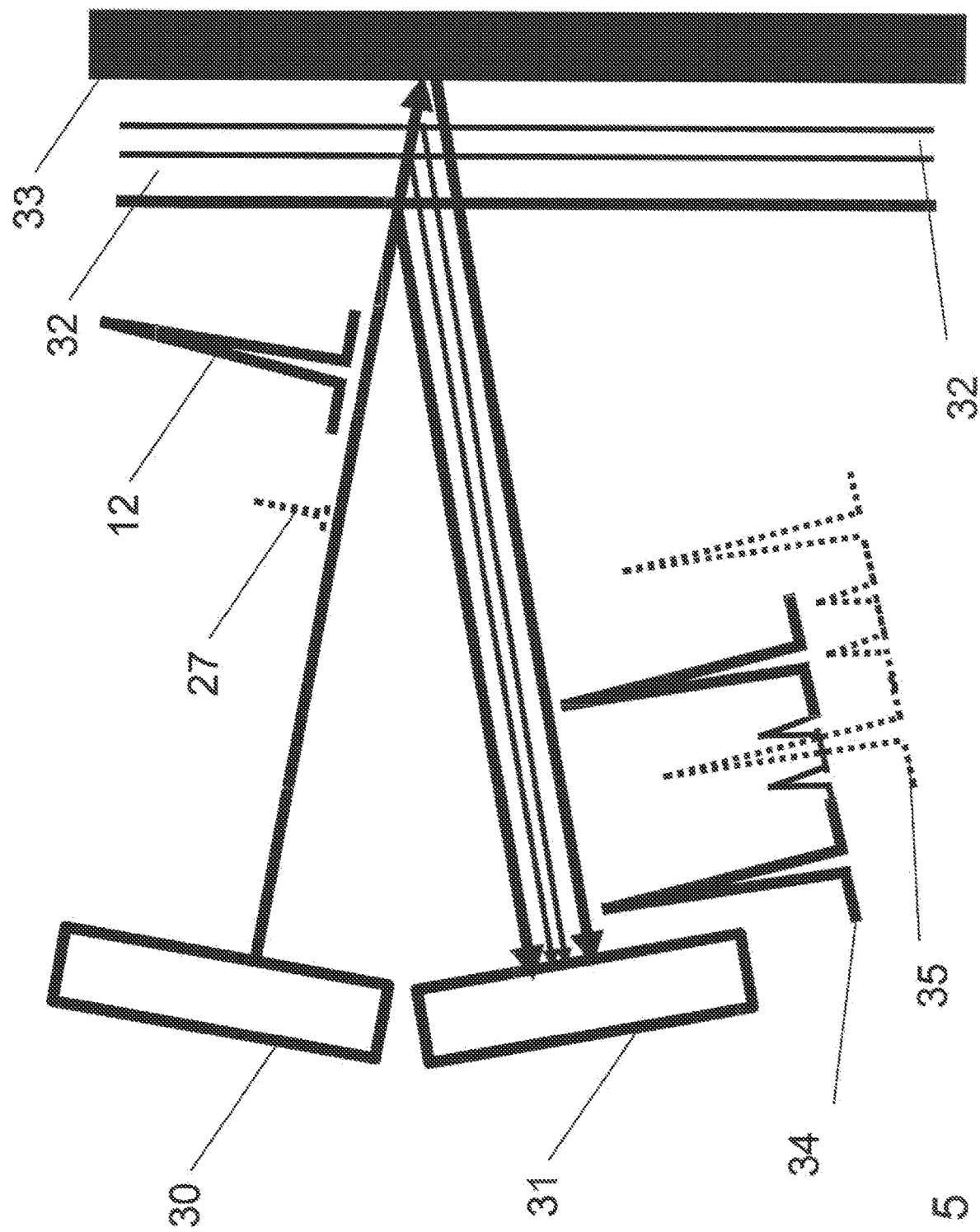
FIG. 5 shows the set-up of FIG. 4 with THz echo pulses.
Figure 6:
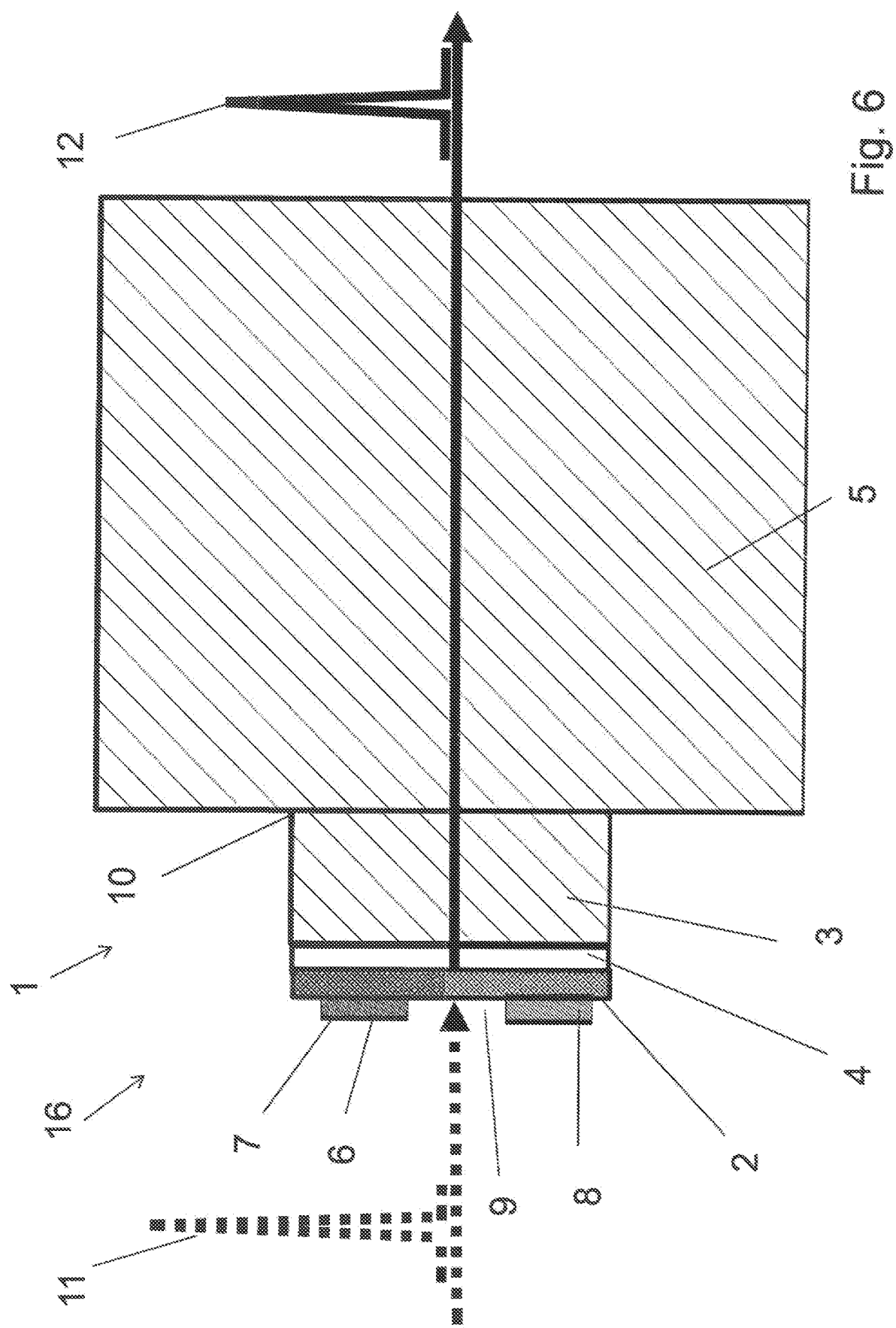
FIG. 6 shows a schematic representation of a THz antenna according to one embodiment of the present invention.

FIG. 6 schematically shows an arrangement 1 which is part of the antenna 16 for generating terahertz radiation 12. The arrangement 1 comprises a photoactive layer 2, a substrate 3, a first adhesion-promoting layer 4 and a carrier 5.

The photoactive layer 2 can be activated by optical radiation 11 from the laser 15 in the range 1200 nm to 1700 nm and thus has a corresponding band gap. Suitable semiconductors for the photoactive layer 2 would be, for example, InGaAs, InAlAs, InGaAsP, InGaAlAs, InGaAlAsP or GaAlAs. The semiconductor used for the photoactive layer 2 is usually doped with a transition metal such as Fe, Rh or Ru, in a concentration of at least $10^{18}$ cm$^3$, especially at least $10^{19}$ cm$^{-3}$. For the generation of THz radiation, layer thicknesses of the photoactive layer 2 of at most 10 μm and at least 0.5 μm are advantageous. In the exemplary embodiment shown, the total layer thickness can be 1 μm to 2 μm. Especially, the photoactive layer 2 consists of a single layer of the photoactive material. The photoactive layer 2 can alternatively comprise several sub-layers. For example, at least one active layer and one adjacent layer can be provided.

The photoactive layer 2 is attached to the substrate 3. The first adhesion-promoting layer 4 applied over the entire surface is used for the attachment. The first adhesion-promoting layer 4 is thus arranged between the photoactive layer 2 and the substrate 3 and connects the two flat and in a flush manner. Due to the adhesion-promoting layer 4, air gaps between the substrate 3 and the photoactive layer 2 can be largely avoided. To further suppress adverse reflections of the laser light 12, a layer thickness of the adhesion-promoting layer 4 should be at most 5 μm. Layer thicknesses in the range of 0.5 μm to 2 μm would be conceivable. A suitable material for the adhesion-promoting layer 4, which is sometimes also called an adhesive layer, would be for example BCB (benzocyclobutene), which is more often used in the prior art for so-called wafer bonding.

The substrate 3 consists of a material transparent to the laser radiation 11 and the THz radiation 12, especially silicon. The substrate 3 is also electrically insulating. The substrate 3 ensures mechanical stability of the photoactive layer 2, in particular during the production of the device 1 (cf. the production method below). The substrate 3 is usually embodied as a plane-parallel plate. The substrate 3 can advantageously be made from a chip of a commercially available silicon wafer. This allows the application of established wafer processing technologies and the parallel production of a large number of structures on one substrate. A first side of the substrate 3 facing the photoactive layer 2 is thus a planar surface. On a second side facing away from the photoactive layer 2, the substrate is attached to the carrier 5. The substrate 3 is thus arranged between the photoactive layer 2 and the carrier 5. A side of the substrate 3 facing the carrier 5 is especially also configured as a planar surface. The substrate 3 especially has a substrate thickness, measured perpendicularly to a substrate plane from the first side to the second side of the substrate 3, which is substantially greater than the layer thickness of the photoactive layer 2. The substrate 3 can, for example, have a substrate thickness of at most 1 mm, although substrate thicknesses of at least 0.2 mm are common. In the exemplary embodiment shown, the substrate 3 has a constant substrate thickness in the range 300 μm to 500 μm. After wafer processing is complete, the structures are separated and attached to the carrier.

The carrier 5 is made of the same material as the substrate 3, but has a much greater thickness. In the exemplary embodiment shown, the carrier 5 is embodied as a plane-parallel silicon body or silicon block. A first side of the carrier 5 facing the substrate 3 is therefore a planar surface. In addition, a second side of the carrier 5, which faces away from the substrate 3, is embodied as a planar surface. The THz radiation 12 generated in the antenna 16 leaves the carrier 5 via the first side of the carrier 5 facing away from the substrate 3. The carrier 5 especially has a carrier thickness, measured from the first side to the second side of the carrier 5, which is substantially greater than the substrate thickness and the thickness of the photoactive layer 2. This allows optical reflections at the carrier 5 to air interface, i.e. at the second side of the carrier 5, to be delayed in time so that they lie outside the measurement window of interest. Exemplary carrier thicknesses are at least 5 mm, especially at least 8 mm. Since the carrier 5 and the substrate 3 are made of the same material, reflections of the optical radiation 11 at the interface between substrate 3 and carrier 5 are strongly suppressed.

The carrier 5 and the substrate 3 are connected flush and their sides lie flat against each other, for example via a press contact. The carrier 5 can thus be directly adjacent to the substrate 3. Alternatively, a second adhesion-promoting layer (not shown) can be provided between the substrate 3 and the carrier 5, which connects the substrate 3 and the carrier 5 flat and flush with each other. The second adhesion-promoting layer can be made of a polymer material, such as BCB.

In addition, an antenna conductor 6 is provided, which comprises a first sub-structure 7 and a second sub-structure 8. The first sub-structure 7 and the second sub-structure 8 are spaced apart from one another by a gap 9. The photoactive layer 2 is free of coating in the region of the aforementioned gap 9 and is exposed there to the ambient air. The optical radiation 11 from the laser 15 is incident on the photoactive layer 2 through the gap 9. Both sub-structures 7, 8 contact the photoactive layer 2 both electrically and mechanically. The sub-structures 7, 8 are usually formed as metal structures, wherein they are formed by vapour deposition or sputtering of metal onto the photoactive layer 2. In the embodiment of FIG. 6, the sub-structures 7, 8 are arranged on a side of the photoactive layer 2 facing away from the substrate 3.

Figure 7:
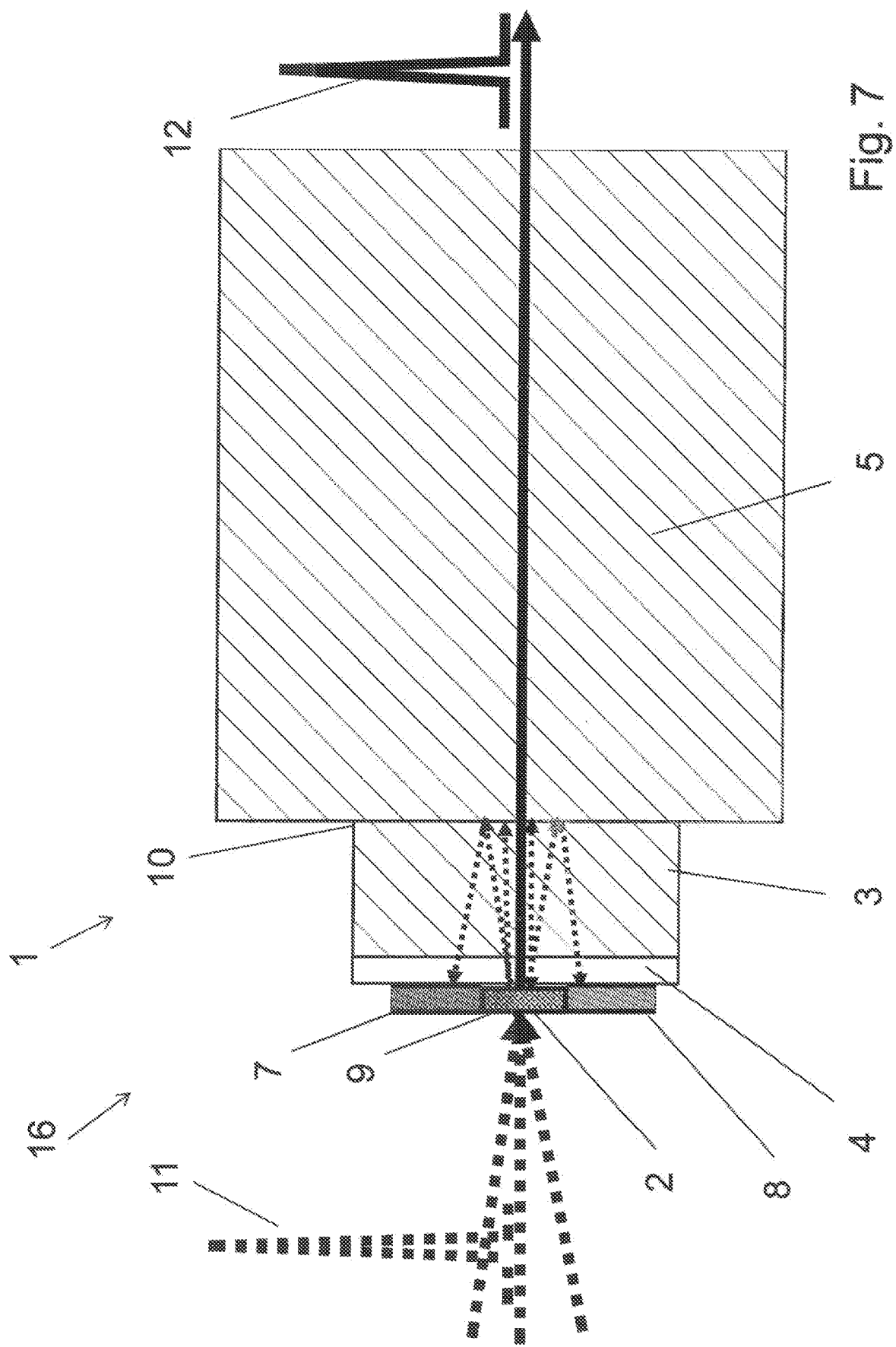
FIG. 7 shows a schematic representation of a further THz antenna according to one embodiment of the present invention.

The THz antenna 16 shown in FIG. 7 differs from the THz antenna shown in FIG. 6 in that the sub-structures 7, 8 of the antenna conductor 6 are arranged laterally next to the photoactive layer 2. The photoactive layer 2 is thus located centrally between the sub-structures 7, 8. The photoactive layer 2 is located inside the gap 9 and fills it completely. In particular, the photoactive layer 2 in the embodiment of FIG. 7 is embodied as a mesa structure with dimensions measured perpendicular to the layer thickness of at most 100 μm by 100 μm. The mesa structure thus has a footprint of at most 0.01 mm$^2$. As indicated in FIG. 7, a perpendicular projection of the photoactive layer 2 onto the substrate has an area which is reduced in such a way that only a very small proportion of the divergent reflections of the optical radiation 11 at the substrate 3 to carrier 5 interface impinge on the back of the photoactive layer 2. As a result, significantly fewer charge carriers are generated in the photoactive layer 2, and THz echo pulses can be effectively minimised. Apart from the arrangement of the sub-structures 7, 8 relative to the photoactive layer 2 and the embodiment of the photoactive layer 2 as a mesa structure, the antenna 16 shown in FIG. 7 has the same characteristics as the antenna of FIG. 6.

Figure 8:
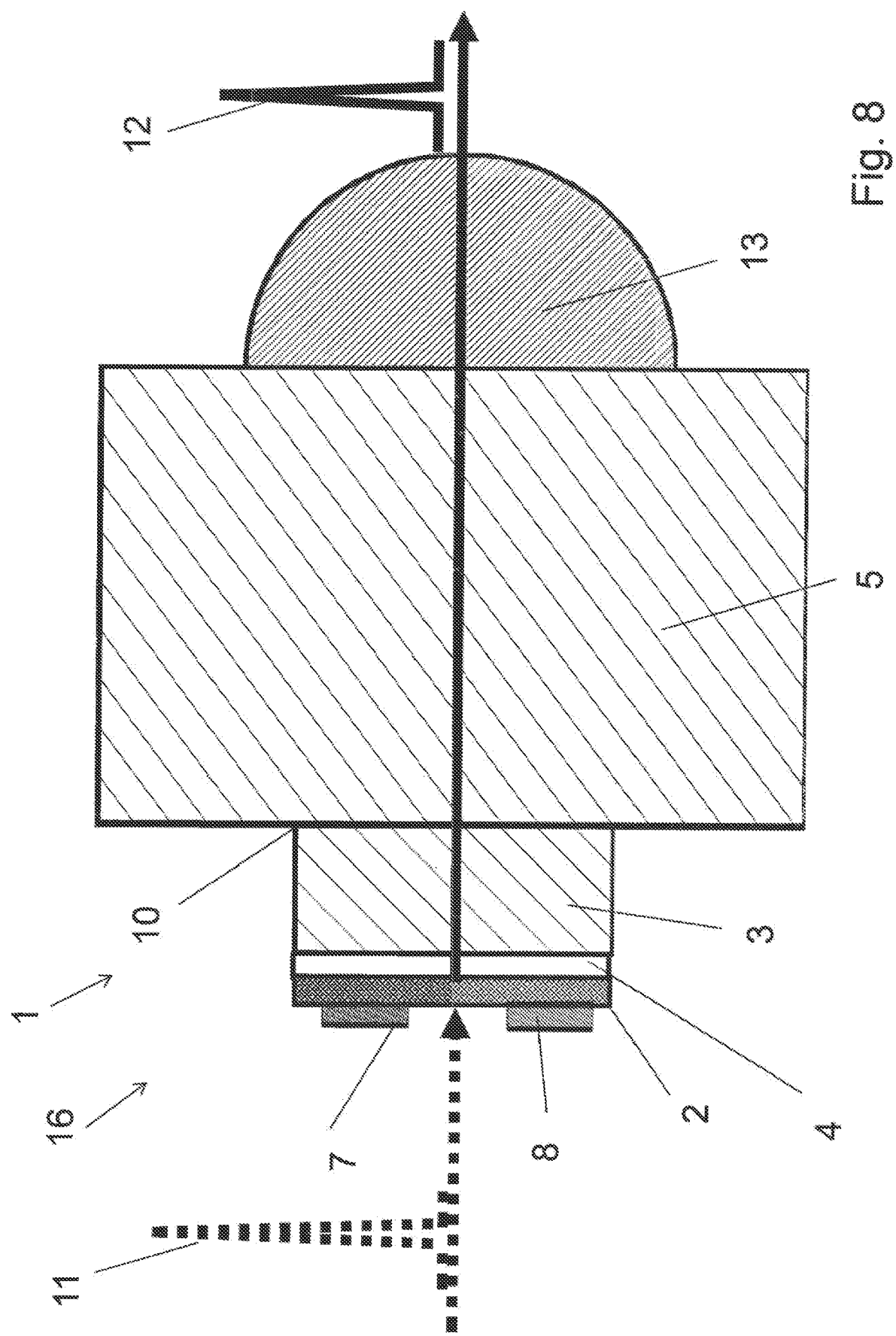
FIG. 8 shows a schematic representation of a further THz antenna according to one embodiment of the present invention.

FIG. 8 shows an antenna 16 which, in addition to the antenna 16 of FIG. 6, has a lens 13 for THz radiation 12. The lens 13 couples the THz radiation 12 out of the antenna 16 and, in the exemplary embodiment of FIG. 8, is formed as a plano-convex lens, in particular a hemispherical lens or a hyperhemispherical lens. The lens 13 is attached to the carrier 5, with the planar side of the lens 13 being connected to the second planar side of the carrier 5. Especially, the lens 13 is made of the same material as the carrier 5 and the substrate 3, i.e. Si in the exemplary embodiment shown. In this case, the lens 13 can be connected to the carrier 5 by means of a press contact, for example, and can be directly adjacent to the carrier 5. Alternatively, other materials can also be used for the lens 13. Polymer materials such as polymethylpentene would be conceivable, for example. In this case, the lens 13 could be connected flush and flat to the carrier 5 by means of a third adhesion-promoting layer, for example by means of an adhesive layer made of BCB. A lens thickness is especially at least 2 mm, in particular at least 3 mm. The lens 13 can have the same thickness as the carrier 5.

Figure 9:
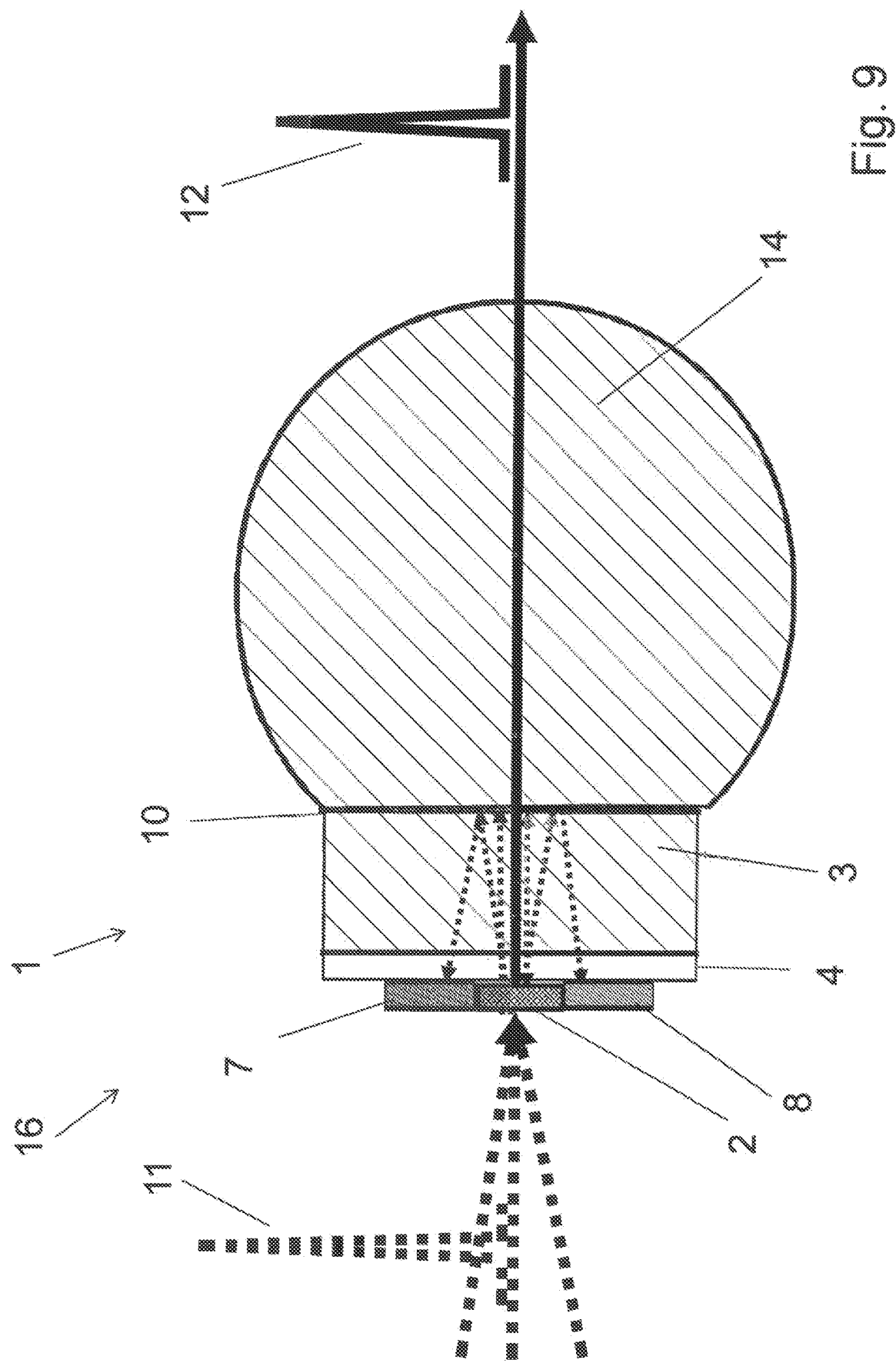
FIG. 9 shows a schematic representation of a further THz antenna according to one embodiment of the present invention.

In an alternative embodiment, the lens can form the carrier. This embodiment of the antenna 16 is shown in FIG. 9. Here, the substrate 3 is thus attached directly to the lens 14 without the need for an additional carrier. The lens 14 can be adjacent to the substrate 3, or a fourth adhesion-promoting layer can be arranged between the lens 14 and the substrate 13 and connects the planar side of the lens 14 and the substrate 3 flat and in a flush manner. The lens 14 is made of the same material as the substrate 3. For further features of the lens 14, please refer to the lens 13 above.

In the antenna 16 of FIG. 9, the photoactive layer 2 and the metal structures 7, 8 of the antenna conductor 6 are constructed in a similar way as in the antenna of FIG. 7. It is clear, however, that alternatively the structure of the photoactive layer 2 and the metal structures 7, 8 of FIG. 6 can be used.

Figure 10:
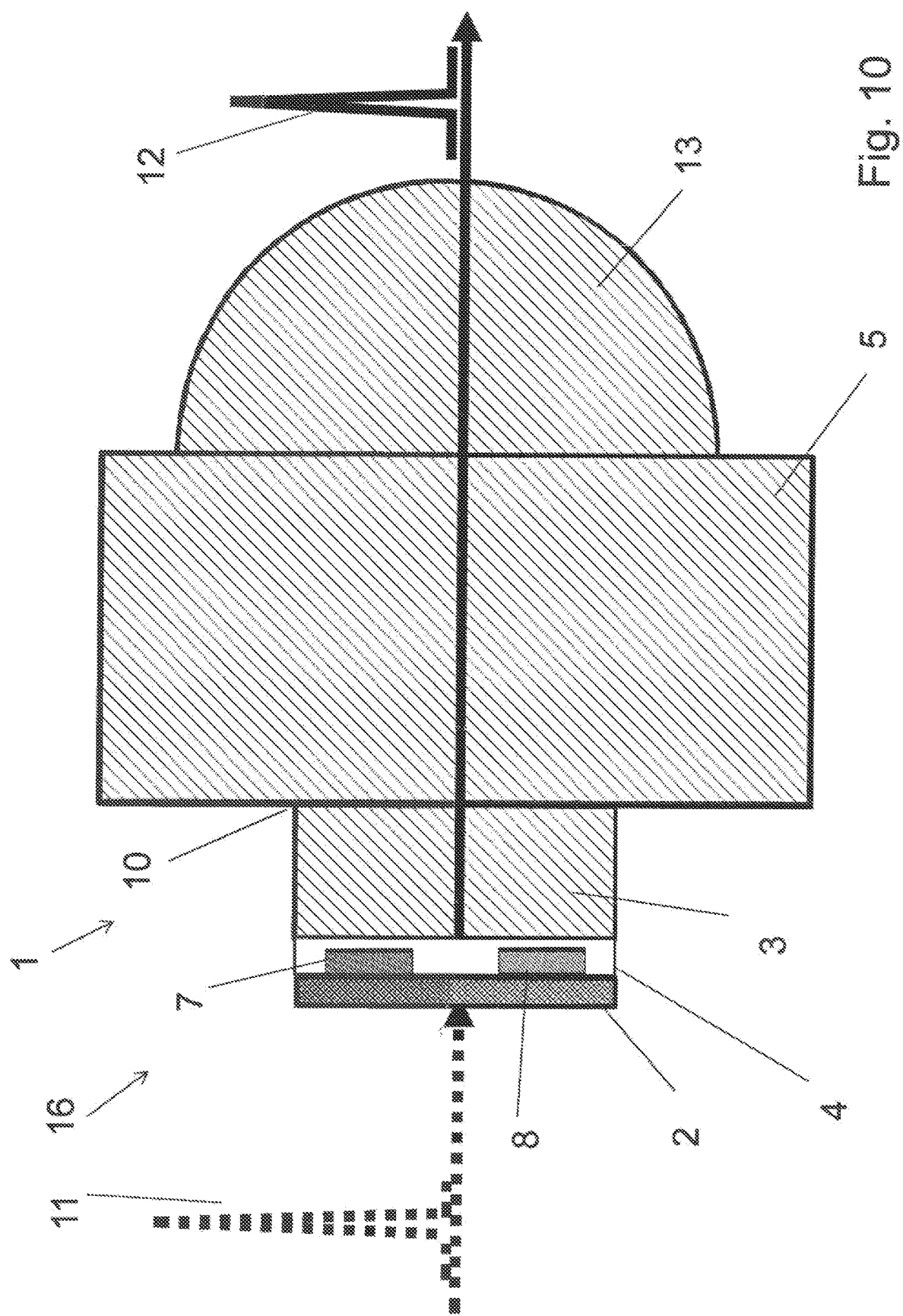
FIG. 10 shows a schematic representation of a further THz antenna according to one embodiment of the present invention.

The antenna 16 shown in FIG. 10 has a similar structure to the antenna of FIG. 8 and differs from the antenna of FIG. 8 only with regard to the arrangement of the metal structures 7, 8. The metal structures 7, 8 of the antenna conductor 6 of FIG. 10 are arranged on a side of the photoactive layer 2 facing the substrate 3, whereas in FIG. 6 they are arranged on a side of the photoactive layer facing away from the substrate 3. In FIG. 10 it is indicated that the first adhesion-promoting layer 4 is arranged between the metal structures 7, 8 and the substrate 3, and connects the metal structures 7, 8 to the substrate 3 flat. The first adhesion-promoting layer 4 thus has a reduced layer thickness in the region of the metal structures 7, 8. An advantage of the arrangement shown in FIG. 10 is that reflected optical radiation strikes the opaque metal structures 7, 8 and thus does not generate free charge carriers in the photoactive layer 2. A side of the photoactive layer 2 facing away from the substrate 3 is completely free of coating and is exposed to the ambient air.

The antennas 16 of FIGS. 6-10 are preferably used in the terahertz system 20 of FIG. 11.

A method for producing the arrangement 1 or for producing the antenna 16 is described below.

First, an auxiliary substrate (not shown) made of InP is provided. Then, the photoactive layer 2 is produced. The photoactive layer 2 is produced by epitaxial growth on the InP auxiliary substrate. Usually, the photoactive layer 2 is grown by means of molecular beam epitaxy at a temperature of 200° C. to 450° C. The temperature is especially 400° C. During epitaxial growth, the photoactive layer 2 is especially doped with a transition metal in a concentration of at least $10^{18}$ cm$^3$.

After the photoactive layer 2 has been produced, the side of the photoactive layer facing away from the auxiliary substrate can be connected over its entire surface to a silicon wafer having a diameter of at least 2 inches, especially at least 3 inches, and a wafer thickness of between 0.2 mm and 1 mm, the first adhesion-promoting layer 4 being used for the connection. The silicon wafer and the auxiliary substrate are now on opposite sides of the photoactive layer 2. The auxiliary substrate is then completely removed, especially by chemical etching. Alternatively, the auxiliary substrate can also be removed mechanically.

In an additional step, the antenna conductor 6 is contacted with the photoactive layer 2. The antenna conductor 6 with the first sub-structure 7 and the second sub-structure 8 is applied to the photoactive layer 2 in such a way that the two sub-structures 7, 8 are spaced apart from one another and contact the photoactive layer 2. The antenna conductor 6 is especially applied in a so-called lift-off process by vapour deposition or sputtering of metal.

The antenna conductor 6 can be applied here immediately before the photoactive layer 2 is connected to the substrate 3 (i.e. before the auxiliary substrate is removed) or only after the auxiliary substrate has been removed.

For the production of the mesa structures of the photoactive layer 2 shown in FIGS. 7 and 9, the photoactive layer 2 can be etched away in regions after removal of the auxiliary substrate, usually by wet-chemical etching processes and dry etching processes. After this, the metal structures 7, 8 can be applied as described above. Alternatively, the mesa structure of the photoactive layer 2 can be produced before connecting the photoactive layer 2 to the silicon wafer. Then, the metal structures 7, 8 are applied to the photoactive layer 2 by vapour deposition or sputtering. The first adhesion-promoting layer 4 is then applied to the metal structures 7, 8 and the photoactive layer 2. Then, the silicon wafer is connected to the photoactive layer 2 via the layer 4. In a further step, the auxiliary substrate is removed, especially completely.

Optionally, a surface passivation, for example made of silicon nitride or silicon oxide, can be applied to the photoactive layer 2 and/or the metal sub-structures 7, 8.

After the photoactive layer 2, the wafer, the adhesion-promoting layer 4 and the metal structures 7, 8 have been arranged relative to each other, the silicon wafer can be cut to form a plurality of chips each comprising a substrate 3 made of Si, the adhesion-promoting layer 4, the photoactive layer 2 and the metal structures 7, 8. The Si wafer is thus used for the production of multiple substrates 3. Of course, the substrate 3 in the form of a chip can also be used instead of the wafer at the beginning of the method.

Then, the substrate 3 is fixed on the carrier 5 or on the lens 14 formed as a carrier. If necessary, the lens 13 is then connected to the carrier 5.

The described method is particularly suitable for producing the above-described arrangement 1 and the described antenna 16 of FIGS. 6-10. Features that are only mentioned in relation to the arrangement and the antenna can also be claimed for the method, and vice versa.

LIST OF REFERENCE SIGNS 1 arrangement for a THz antenna
2 photoactive layer
3 substrate
4 adhesion-promoting layer
5 carrier
6 antenna conductor
7 metal structure
8 metal structure
9 gap
10 planar interface
11 fs laser pulse
12 THz pulse
13 lens
14 lens
15 laser
16 transmitting antenna
17 receiving antenna
18 optical fibre
19 delay circuit
20 terahertz system
21 photoactive layer
22 substrate
23 metal structure
24 metal structure
25 carrier
26 interface
27 echo pulse
28 beam splitter
29 sample
30 THz transmitter
31 THz receiver
32 paint layer
33 metal carrier
34 THz reflection pattern
35 replica
36 sample

The invention claimed is:

1. An arrangement for an antenna for generating or receiving terahertz radiation comprising:
a photoactive layer that can be activated by optical radiation in a range of 1200 nm to 1700 nm, inclusive;
a substrate transparent to the optical radiation, and to which the photoactive layer is attached; and
a carrier transparent to the optical radiation, wherein the substrate is attached to the carrier and is arranged between the photoactive layer and the carrier, wherein the substrate and the carrier are made of the same material, wherein a first adhesion-promoting layer is arranged between the photoactive layer and the substrate such that the photoactive layer and the substrate layer are situated flat and flush with each other with the first adhesion-promoting layer therebetween, and wherein the first adhesion-promoting layer has a layer thickness of no more than 5 µm.

2. The arrangement according to claim 1, wherein at least one of the photoactive layer has a layer thickness of at most 10 µm, the substrate has a substrate thickness of at most 1 mm, or the carrier has a carrier thickness of at least 3 mm.

3. The arrangement according to claim 1, wherein at least one of the carrier and the substrate are made of silicon or wherein the photoactive layer is made at least predominantly of at least one of InGaAs, InAlAs, InGaAsP, InGaAlAs, InGaAlAsP, or GaAlAs and is doped with a transition metal.

4. The arrangement according to claim 1, wherein at least one of the substrate is embodied as a plane-parallel plate or the carrier is embodied as a plane-parallel body.

5. The arrangement according to claim 1, comprising:
a lens for terahertz radiation, wherein the lens is attached to the carrier, or wherein the lens forms the carrier.

6. The arrangement according to claim 1, wherein a side of the photoactive layer facing away from the substrate is free of coating, at least in some regions, and is exposed to ambient air.

7. An antenna for generating or receiving terahertz radiation comprising:
an antenna arrangement for generating or receiving terahertz radiation; and
an antenna conductor, the antenna conductor comprising:
a first sub-structure; and
a second sub-structure;
wherein the antenna arrangement comprises:
a photoactive layer that can be activated by optical radiation in a range of 1200 nm to 1700 nm, inclusive;
a substrate transparent to the optical radiation attached to the photoactive layer; and
a carrier transparent to the optical radiation attached to the substrate, arranged between the photoactive layer and the carrier, wherein the substrate and the carrier are made from identical material, wherein a first adhesion-promoting layer is arranged between the photoactive layer and the substrate such that the photoactive layer and the substrate are situated flat and flush with each other with the first adhesion-promoting layer therebetween, and wherein the first adhesion-promoting layer has a thickness of at most 5 µm; and
wherein the first sub-structure and the second sub-structure are distanced from one another by a gap and contact the photoactive layer.

8. The antenna according to claim 7, wherein the antenna conductor is arranged on a side of the photoactive layer facing away from the substrate.

9. The antenna according to claim 7, wherein the first sub-structure and the second sub-structure are arranged on the substrate laterally next to the photoactive layer, and wherein the photoactive layer is arranged between the first sub-structure and the second sub-structure.

10. The antenna according to claim 9, wherein the photoactive layer has a footprint of at most 1 $mm^2$.

11. A terahertz system for generating and coherently detecting terahertz radiation comprising:
a laser light source; and
two terahertz (THz) antennas, wherein each of the THz antennas are optically coupled to the laser light source and can be activated by optical radiation from the laser light source, wherein a first of the antennas serves as a transmitting antenna and a second of the antennas serves as a receiving antenna, and wherein at least one of the transmitting antenna or the receiving antenna comprise:
an antenna conductor comprising a first sub-structure and a second sub-structure; and
an antenna arrangement comprising:
a photoactive layer that can be activated by optical radiation in a range of 1200 nm to 1700 nm, inclusive;
a substrate transparent to the optical radiation attached to the photoactive layer; and a carrier transparent to the optical radiation attached to the substrate, arranged between the photoactive layer and the carrier, wherein the substrate and the carrier are made from identical material, wherein a first adhesion-promoting layer is arranged between the photoactive layer and the substrate such that the photoactive layer and the substrate are situated flat and flush with each other with the first adhesion-promoting layer therebetween, and wherein the first adhesion-promoting layer has a thickness of at most 5 µm; and wherein the first sub-structure and the second sub-structure are distanced from one another by a gap and contact the photoactive layer, and wherein the antenna conductor is arranged on a side of the photoactive layer away from or toward the substrate.

12. The terahertz system according to claim 11, wherein the optical radiation of the laser light source has a wavelength of at least 1200 nm and/or at most 1700 nm.

13. A method for producing an arrangement for an antenna for generating or receiving terahertz radiation, the method comprising:

producing a photoactive layer on an auxiliary substrate which is at least predominantly formed from InP;

connecting the photoactive layer flat to a substrate by means of a first adhesion-promoting layer which has a layer thickness of at most 5 µm;

removing the auxiliary substrate, especially by chemical etching, and attaching the substrate to a carrier so that the substrate is arranged between the photoactive layer and the carrier, wherein the photoactive layer is activated by optical radiation in a range of 1200 nm to 1700 nm, wherein the substrate and the carrier are made of the same material, and wherein the substrate and the carrier are transparent to the optical radiation.

14. The method according to claim 13, wherein at least one of the photoactive layer is grown using of molecular beam epitaxy at a temperature of from 200° C. to 450° C., or the photoactive layer is epitaxially grown and is doped with a transition metal in a concentration of at least 1018 $cm^{-3}$.

15. The method according to claim 13, comprising:

applying an antenna conductor having a first sub-structure and a second sub-structure to the photoactive layer such that the two sub-structures are spaced apart from one another and contact the photoactive layer, wherein applying the antenna conductor to the photoactive layer is performed before connecting the photoactive layer to the substrate or after removing the auxiliary substrate.

16. The arrangement according to claim 2, wherein at least one of the photoactive layer had a thickness of at least 0.5 µm, the substrate has a substrate thickness of at least 0.2 mm, or the carrier has a carrier thickness of at least 5 mm.

17. The arrangement according to claim 5, wherein the lens is a plano-convex lens, a hemispherical lens, or a hyperhemispherical lens.

18. The antenna according to claim 7, wherein the antenna conductor is arranged on a side of the photoactive layer facing toward the substrate.

19. The antenna according to claim 9, wherein the photoactive layer has a footprint of at most 0.1 $mm^2$.

20. The antenna according to claim 9, wherein the photoactive layer has a footprint of at most 0.01 $mm^2$.

* * * * *